US012721022B2

(12) United States Patent
Lee

(10) Patent No.: US 12,721,022 B2
(45) Date of Patent: Aug. 25, 2026

(54) DISPLAY DEVICE COMPRISING HEAT DISSIPATION LAYER AND METHOD FOR MANUFACTURING THE SAME

(71) Applicant: Samsung Display Co., LTD., Yongin-si (KR)

(72) Inventor: Dayoung Lee, Cheonan-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 699 days.

(21) Appl. No.: 17/885,991

(22) Filed: Aug. 11, 2022

(65) Prior Publication Data

US 2023/0232658 A1 Jul. 20, 2023

(30) Foreign Application Priority Data

Jan. 17, 2022 (KR) ........................ 10-2022-0006468

(51) Int. Cl.

*H10K 59/80* (2023.01)
*H10K 59/12* (2023.01)
*H10K 71/00* (2023.01)

(52) U.S. Cl.

CPC ......... *H10K 59/8794* (2023.02); *H10K 59/12* (2023.02); *H10K 59/87* (2023.02); *H10K 71/00* (2023.02); *H10K 59/1201* (2023.02)

(58) Field of Classification Search

CPC .... H10K 50/87; H10K 71/00; H10K 59/8794; H01L 33/641; H01L 2933/0075; H05K 7/20963; H05K 7/20; H05K 7/20972

See application file for complete search history.

(56) References Cited

U.S. PATENT DOCUMENTS 7,855,394 B2 * 12/2010 Li .............................. F21K 9/00 257/E33.061
2014/0145164 A1 * 5/2014 Odaka .................. H10K 59/131 257/40
2017/0194595 A1 * 7/2017 Li ....................... H10K 59/8794
2018/0114933 A1 * 4/2018 Huang ............... H10D 30/6704
2019/0131325 A1 * 5/2019 Liu ................... G02F 1/133385
2020/0251677 A1 * 8/2020 Wang .................... H10W 40/25
2023/0255053 A1 * 8/2023 Chen .................. H10K 59/8794 361/708

FOREIGN PATENT DOCUMENTS

KR 10-1037587 5/2011
KR 10-1773589 8/2017
KR 10-2018-0036835 4/2018
KR 10-2019-0009203 1/2019
KR 10-2020-0135672 12/2020
KR 10-2020-0139569 12/2020

* cited by examiner

*Primary Examiner* — Chad M Dicke
*Assistant Examiner* — Jeremy Daniel Watts
(74) *Attorney, Agent, or Firm* — Harness, Dickey & Pierce, P.L.C.

(57) ABSTRACT

A display device according to an embodiment includes: a first substrate; a transistor disposed on the first substrate; a light emitting element electrically connected to the transistor; an inner heat dissipation layer disposed below the light emitting element; and an external heat dissipation layer connected to the inner heat dissipation layer.

16 Claims, 15 Drawing Sheets

DISPLAY DEVICE COMPRISING HEAT DISSIPATION LAYER AND METHOD FOR MANUFACTURING THE SAME

CROSS-REFERENCE TO RELATED APPLICATION

This application claims priority to and benefit of Korean Patent Application No. 10-2022-0006468 under 35 U.S.C. § 119, filed on Jan. 17, 2022, in the Korean Intellectual Property Office (KIPO), the disclosure of which is incorporated by reference herein in its entirety.

BACKGROUND

1. Technical Field

The disclosure relates to a display device and a manufacturing method thereof.

2. Description of the Related Art

A display device is a device that displays an image, and includes a liquid crystal display (LCD), an organic light emitting diode (OLED) display, and the like. Such a display device is used in various electronic devices such as portable phones, navigation devices, digital cameras, electronic books, portable game devices, or various terminals.

An organic light emitting diode (OLED) display includes two electrodes and an organic emission layer positioned between them, and an electron injected from one electrode and a hole injected from another electrode are combined in the organic emission layer, thereby forming an exciton. As the exciton changes from an exited state to a ground state, it releases energy and emits light.

As such, as the light emitting element emits light in the display device, heat may be generated, and the temperature of the display device may rise. Efficiency and life-span of the light emitting element may deteriorate due to the temperature rise.

The above information disclosed in this Background section is only for enhancement of understanding of the background of the described technology, and therefore it may contain information that does not form the prior art that is already known in this country to a person of ordinary skill in the art.

SUMMARY

Embodiments are to provide a display device that can increase the efficiency and life-span of the light emitting element by reducing the heat generated in the light emitting element or by emitting the generated heat to the outside, and a manufacturing method of the display device.

A display device according to an embodiment may include: a first substrate; a transistor disposed on the first substrate; a light emitting element electrically connected to the transistor; an inner heat dissipation layer disposed below the light emitting element; and an external heat dissipation layer connected to the inner heat dissipation layer.

The transistor may include: a semiconductor disposed on the first substrate; a gate electrode that overlaps the semiconductor in a plan view; and a source electrode and a drain electrode that are electrically connected to the semiconductor. The inner heat dissipation layer, the source electrode, and the drain electrode may be disposed on a same layer.

The display device according to the embodiment may further include: a gate insulating layer disposed between the semiconductor and the gate electrode; and an interlayer insulating layer disposed on the gate electrode. The source electrode, the drain electrode, and the inner heat dissipation layer may be disposed on the interlayer insulating layer.

A thickness of the inner heat dissipation layer, a thickness of the source electrode, and a thickness of the drain electrode may be equal to each other.

The display device according to the embodiment may further include a protective layer disposed on the source electrode, the drain electrode, and the inner heat dissipation layer. The light emitting element may be disposed on the protective layer.

The display device may include a display area and a peripheral area disposed adjacent to the display area, a hole may be formed in the first substrate in the peripheral area, the external heat dissipation layer may be disposed on an outer surface of the first substrate and in the hole, and the external heat dissipation layer may be connected to the inner heat dissipation layer through the hole.

A plurality of holes that are spaced apart from each other may be formed in the first substrate in the peripheral area, and each of the plurality of holes may have a bar shape or a dot shape in a plan view arranged along an edge of the first substrate.

The display device according to the embodiment may further include an encapsulation layer disposed on the light emitting element.

The display device according to the embodiment may further include a second substrate disposed on the light emitting element. The external heat dissipation layer may be disposed on an outer surface of the second substrate.

The display device may include a display area and a peripheral area disposed adjacent to the display area, and the external heat dissipation layer may be disposed on the second substrate in the peripheral area.

A method for manufacturing a display device according to an embodiment may include: forming a transistor on a first substrate; forming an inner heat dissipation layer by depositing a first heat radiation material on the transistor and patterning the first heat radiation material; forming a light emitting element electrically connected to the transistor on the inner heat dissipation layer; and forming an external heat dissipation layer to be connected to the inner heat dissipation layer. The display device may include a display area and a peripheral area disposed adjacent to the display area.

The forming of the transistor may include: forming a semiconductor on the first substrate; forming a gate electrode to overlap the semiconductor; and forming a source electrode and a drain electrode to be electrically connected to the semiconductor. The inner heat dissipation layer, the source electrode, and the drain electrode may be disposed on a same layer.

The method for manufacturing the display device according to the embodiment may further include: forming a gate insulating layer on the semiconductor; and forming an interlayer insulating layer on the gate electrode, wherein the source electrode, the drain electrode, and the inner heat dissipation layer may be formed on the interlayer insulating layer.

A thickness of the inner heat dissipation layer, a thickness of the source electrode, and a thickness of the drain electrode may be equal to each other.

The method for manufacturing the display device according to the embodiment may further include forming a protective layer on the source electrode, the drain electrode, and the inner heat dissipation layer. The light emitting element may be formed on the protective layer.

The method for manufacturing the display device may further include forming a hole in the first substrate in the peripheral area before forming of the external heat dissipation layer. In the forming of the external heat dissipation layer, the external heat dissipation layer may be formed by depositing a second heat radiation material on an outer surface of the first substrate. The external heat dissipation layer may be disposed on the outer surface of the first substrate and inside the hole. The external heat dissipation layer may be connected to the inner heat dissipation layer through the hole.

A plurality of holes that are spaced apart from each other may be formed in the first substrate in the peripheral area, and each of the plurality of holes may have a bar shape or a dot shape in a plan view arranged along an edge of the first substrate.

The method for manufacturing the display device according to the embodiment may further include forming an encapsulation layer on the light emitting element.

The method for manufacturing the display device according to the embodiment may further include: forming a second substrate on the light emitting element; and forming a hole in the second substrate in the peripheral area. In the forming of the external heat dissipation layer, the external heat dissipation layer may be formed by depositing a second heat radiation material on an outer surface of the second substrate. The external heat dissipation layer may be disposed on the outer surface of the second substrate and inside the hole. The external heat dissipation layer may be connected to the inner heat dissipation layer through the hole.

The external heat dissipation layer may be disposed on the second substrate in the peripheral area.

According to the embodiments, it is possible to reduce the heat generated in the light emitting element of the display device, and the generated heat can be emitted to the outside, thereby increasing the efficiency and life-span of the light emitting element.

BRIEF DESCRIPTION OF THE DRAWINGS

FIG. 2 to FIG. 4 are plan views of the display device according to an embodiment.

FIG. 5 to FIG. 11 are schematic cross-sectional views showing manufacturing processes of a display device according to an embodiment.

FIG. 13 is a schematic cross-sectional view of a display device according to an embodiment.

FIG. 14 is a schematic cross-sectional view of a display device according to an embodiment.

FIG. 15 is a plan view of the display device according to an embodiment.

DETAILED DESCRIPTION OF THE EMBODIMENTS

Figure 1:
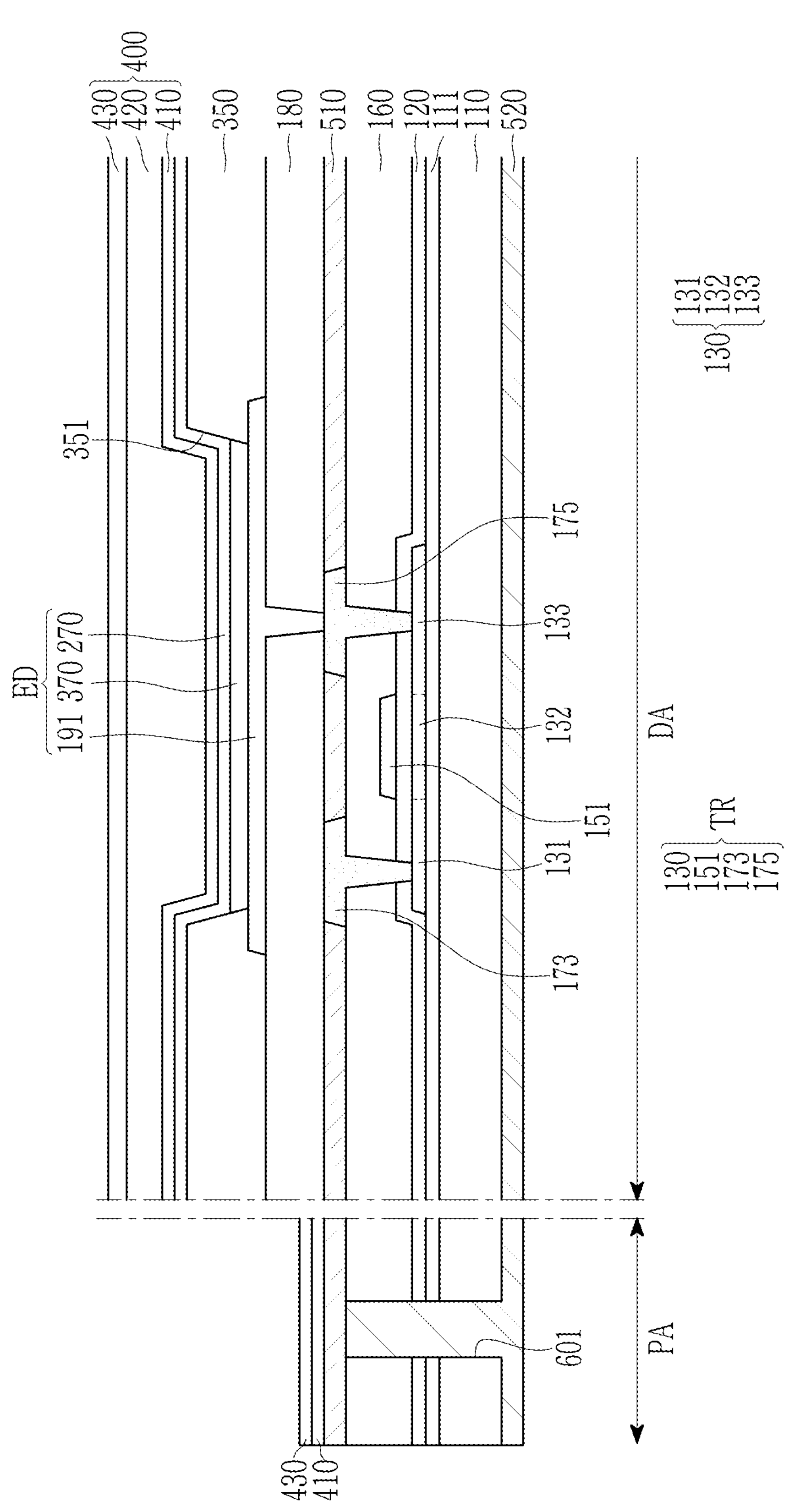
FIG. 1 is a schematic cross-sectional view of a display device according to an embodiment.

Hereinafter, with reference to the accompanying drawing, various embodiments will be described in detail such that a person of an ordinary skill in the technical field to which the disclosure belongs can practice. The disclosure may be implemented in several different forms and is not limited to the embodiments described herein.

In order to clearly explain the disclosure, parts irrelevant to the description are omitted, and like reference numerals designate like elements throughout the specification.

Since the size and thickness of each component shown in the drawing are arbitrarily indicated for better understanding and ease of description, the disclosure is not necessarily limited to the illustrated drawings. In the drawings, the thickness of layers, films, panels, regions, etc., are exaggerated for clarity. In the drawing, the thickness of some layers and regions is exaggerated for better understanding and ease of description.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, referring to FIG. 1, a display device according to an embodiment will be described.

FIG. 1 is a schematic cross-sectional view of a display device according to an embodiment.

As shown in FIG. 1, a display device according to an embodiment may include a first substrate 110, a transistor TR positioned on the first substrate 110, a light emitting element ED electrically connected to the transistor TR, an inner heat dissipation layer 510 positioned under the light emitting element ED, and an outer heat dissipation layer 520 connected to the inner heat dissipation layer 510.

The first substrate 110 may include at least one of polystyrene, polyvinyl alcohol, polymethyl methacrylate, polyethersulfone, polyacrylate, polyetherimide, Polyethylene naphthalate, polyethylene terephthalate, polyphenylene sulfide, polyarylate, polyimide (polyimide), polycarbonate, triacetate cellulose (triacetate cellulose), and cellulose acetate propionate (cellulose acetate propionate). The first substrate 110 may include a flexible material that may be bent or folded, and may be single-layered or multi-layered.

The first substrate 110 may include a display area DA and a peripheral area PA (or the display area DA and the peripheral area PA may be defined in the display device). The display area DA may be a region where multiple pixels are formed and may display an image, and the peripheral area PA may be a region where an image is not displayed. A transistor TR and a light emitting element ED may be positioned in each of the pixels of the display area DA. The peripheral area PA may be positioned outside the display area DA. The peripheral area PA may have a shape surrounding the display area DA. A driver that generates a signal to drive a pixel, a wire that transmits a signal from the driver, and the like may be positioned in the peripheral area PA.

A buffer layer 111 may be positioned on the first substrate 110. The buffer layer 111 may be positioned on an inner surface of the first substrate 110. The buffer layer 111 may have a single-layered or a multi-layered structure. The buffer layer 111 may include an inorganic insulating material such as silicon nitride ($SiN_x$), silicon oxide ($SiO_x$), silicon oxynitride ($SiO_xN_y$), and the like, or an organic insulating material. The buffer layer 111 may be omitted. A barrier layer may be further positioned between the first substrate 110 and the buffer layer 111. The barrier layer may have a single-layered or multi-layered structure. The barrier layer may include an inorganic insulating material such as silicon nitride ($SiN_x$), silicon oxide ($SiO_x$), silicon oxynitride ($SiO_xN_y$), and the like.

A semiconductor 130 may be positioned on the buffer layer 111. The semiconductor 130 may include a first region 131, a channel 132, and a second region 133. The first region 131 and second region 133 may be positioned at opposite sides of the channel 132 of the semiconductor 130. The semiconductor 130 may include a semiconductor material such as amorphous silicon, polysilicon, an oxide semiconductor, and the like.

A gate insulating layer 120 may be positioned on the semiconductor 130. The gate insulating layer 120 may have a single-layer or multi-layer structure. The gate insulating layer 120 may include an inorganic insulating material such as silicon nitride ($SiN_x$), silicon oxide ($SiO_x$), silicon oxynitride ($SiO_xN_y$), and the like.

A gate electrode 151 may be positioned on the gate insulating layer 120. The gate electrode 151 may overlap the channel 132 of the semiconductor 130. The gate electrode 151 may have a single-layer or multi-layer structure. The gate electrode 151 may include a metallic material such as molybdenum (Mo), aluminum (Al), copper (Cu), and/or titanium (Ti). After forming the gate electrode 151, a doping process or plasma treatment may be performed. The channel 132 of the semiconductor 130, covered by the gate electrode 151 may be not doped or plasma-treated, and the first region 131 and the second region 133 of the semiconductor 130, not covered by the gate electrode 151, may be doped or plasma-treated to obtain the same characteristic as the conductor.

An interlayer insulating layer 160 may be positioned on the gate electrode 151. The interlayer insulating layer 160 may have a single-layer or multi-layer structure. The interlayer insulating layer 160 may include an inorganic insulating material or an organic insulating material.

A source electrode 173 and a drain electrode 175 may be positioned on the interlayer insulating layer 160. The source electrode 173 and the drain electrode 175 may have a single-layer or multi-layer structure. The source electrode 173 and the drain electrode 175 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), copper (Cu), and the like. For example, the source electrode 173 and the drain electrode 175 may include a lower layer, an intermediate layer, and an upper layer, the intermediate layer may be made of aluminum (Al), while the lower layer and the upper layer may be made of titanium (Ti).

The interlayer insulating layer 160 may include an opening overlapping the source electrode 173 and the first region 131 of the semiconductor 130. The source electrode 173 may be electrically connected to the first region 131 of the semiconductor 130 through the opening of the interlayer insulating layer 160. The interlayer insulating layer 160 may include another opening overlapping the second region 133 and the drain electrode 175 of the semiconductor 130. The drain electrode 175 may be electrically connected to the second region 133 of the semiconductor 130 through the opening of the interlayer insulating layer 160.

The semiconductor 130, the gate electrode 151, the source electrode 173, and the drain electrode 175 may form a transistor TR. The transistor TR may be positioned on an inner surface of the first substrate 110. Depending on embodiments, the transistor TR may include only the source region and the drain region of the semiconductor 130 instead of the source electrode 173 and the drain electrode 175. Although a single transistor TR is illustrated in FIG. 1, the display device according to an embodiment may include multiple pixels, and each pixel may include multiple transistors.

The inner heat dissipation layer 510 may be positioned on the interlayer insulating layer 160. The inner heat dissipation layer 510, source electrode 173, and the drain electrode 175 may be positioned on the same layer. The inner heat dissipation layer 510 may be formed of a material different from that of the source electrode 173 and the drain electrode 175, and may be formed through a separate process rather than being integral each other. The inner heat dissipation layer 510 may be formed of a non-conductive material, and may be made of a material having a high thermal conductivity. The inner heat dissipation layer 510 may be entirely positioned on the interlayer insulating layer 160 except for a part where the source electrode 173 and the drain electrode 175 are positioned. The inner heat dissipation layer 510 may be positioned in the display area DA and the peripheral area PA. The buffer layer 111, the gate insulating layer 120, and the interlayer insulating layer 160 may be positioned between the first substrate 110 and the inner heat dissipation layer 510. In some embodiments, at least a part of the buffer layer 111, the gate insulating layer 120, and the interlayer insulating layer 160 in the peripheral area PA may be omitted. Therefore, at least some of the buffer layer 111, the gate insulating layer 120, and the interlayer insulating layer 160 may not be positioned under the inner heat dissipation layer 510 in the peripheral area PA. The inner heat dissipation layer 510 may be positioned directly on the inner surface of the peripheral area PA of the first substrate 110. A side surface of the inner heat dissipation layer 510 may contact a side surface of the source electrode 173 and a side surface of the drain electrode 175. A thickness of the inner heat dissipation layer 510 may be substantially similar to a thickness of the source electrode 173 and the drain electrode 175. Accordingly, an upper surface of the inner heat dissipation layer 510 and upper surfaces of the source electrode 173 and the drain electrode 175 may be flat.

A protective layer 180 may be positioned on the source electrode 173, the drain electrode 175, and the inner heat dissipation layer 510. The protective layer 180 may include an organic insulation material such as a general-purpose polymer such as polymethyl methacrylate (PMMA) or polystyrene (PS), polymer derivatives with phenolic groups, acryl-based polymers, imide-based polymers, polyimides, acryl-based polymers, siloxane-based polymers, and the like.

The first electrode 191 may be positioned on the protective layer 180. The first electrode 191 may be also called an anode, and may be formed of a single layer including a transparent conductive oxide film or a metallic material, or a multi-layer including the same. The transparent conductive oxide film may include indium tin oxide (ITO), poly-ITO, indium zinc oxide (IZO), indium gallium zinc oxide (IGZO), indium tin zinc oxide (ITZO), and the like. The metallic material may include silver (Ag), molybdenum (Mo), copper (Cu), gold (Au), and aluminum (Al). For example, the first electrode 191 may include a lower layer, a middle layer, and an upper layer. The lower layer of the first electrode 191 may be positioned directly on the protective layer 180, the middle layer may be positioned on the lower layer, and the upper layer may be positioned on the middle layer. The middle layer of the first electrode 191 may be made of a material that is different from that of the lower layer and the upper layer. For example, the middle layer may be made of silver (Ag), and the lower layer and the upper layer may be made of ITO.

The protective layer 180 may include an opening overlapping the drain electrode 175 and the first electrode 191. The first electrode 191 may be electrically connected to the drain electrode 175 through the opening of the protective layer 180.

A partitioning wall or bank 350 may be positioned on the first electrode 191. A pixel opening 351 may be formed in the bank 350, and the pixel opening 351 of the bank 350 may overlap the first electrode 191. The pixel opening 351 may overlap a central portion of the first electrode 191. Accordingly, the bank 350 may be formed to cover an edge of the first electrode 191. The bank 350 may include an organic insulation material such as a general-purpose polymer such as polymethyl methacrylate (PMMA) or polystyrene (PS), polymer derivatives with phenolic groups, acryl-based polymers, imide-based polymers, polyimides, acryl-based polymers, siloxane-based polymers, and the like.

An emission layer 370 may be positioned within the pixel opening 351 of the bank 350. The emission layer 370 may overlap the first electrode 191. The emission layer 370 may include an organic material that emits light such as red, green, and blue. The emission layer 370 may include a low-molecular or high-molecular organic material. Although the emission layer 370 is shown as a single layer in FIG. 1, an auxiliary layer such as a hole injection layer (HIL), a hole transporting layer (HTL), an electron transporting layer (ETL), and an electron injection layer (EIL) may further be positioned above and below the emission layer 370. The hole injection layer (HIL) and the hole transporting layer may be positioned below the emission layer 370, and an electron transporting layer and an electron injection layer (EIL) may be positioned on the emission layer 370.

The second electrode 270 may be positioned on the emission layer 370 and the bank 350. The second electrode 270 may include a reflective metal containing calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), calcium (Ca), and the like, or a transparent conductive oxide (TCO) such as indium tin oxide (ITO) and indium zinc oxide (IZO).

The first electrode 191, the emission layer 370, and the second electrode 270 may form the light emitting element ED, wherein the first electrode 191 may be an anode that is a hole injection electrode and the second electrode 270 may be a cathode that is an electron injection electrode. However, the disclosure is not limited thereto, and the anode and the cathode may be reversed according to a driving method of the display device. Holes and electrons may be injected into the emission layer 370 from the first electrode 191 and the second electrode 270, respectively, and light emission may occur when excitons combined with injected holes and electrons fall from an exited state to a ground state.

A light emitting element ED may be positioned on the protective layer 180 and may be electrically connected to a transistor TR. The source electrode 173 and the drain electrode 175 may be disposed below the protective layer 180, and due to the electrode layer, an upper surface of the protective layer 180 may have a step such that heat generated during the light emitting element emits light may be concentrated on the step portion. In the display device according to the embodiment, the inner heat dissipation layer 510, the source electrode 173, and the drain electrode 175 may be positioned on the same layer, and thus the upper surface of the protective layer 180 may be made flat. As the first electrode 191 and the emission layer 370 are formed on the flat protective layer 180, heat may be prevented from being concentrated in some regions of the light emitting element ED and heat generation may be reduced. Accordingly, the efficiency and life-span of the light emitting element ED may be increased.

An encapsulation layer 400 may be positioned on the second electrode 270. The encapsulation layer 400 may include at least one inorganic layer and at least one organic layer. In the embodiment, the encapsulation layer 400 may include a first inorganic encapsulation layer 410, an organic encapsulation layer 420, and a second inorganic encapsulation layer 430. However, this is only an example, and the number of inorganic and organic layers forming the encapsulation layer 400 may be variously changed. The first inorganic encapsulation layer 410, the organic encapsulation layer 420, and the second inorganic encapsulation layer 430 may be positioned in the display area DA and a part of the peripheral area PA. The organic encapsulation layer 420 may be formed around the display area DA, and the first inorganic encapsulation layer 410 and the second inorganic encapsulation layer 430 may extend to the peripheral area PA. The encapsulation layer 400 may protect the light emitting element ED from moisture or oxygen that may be inflowed from the outside, and ends of the first inorganic encapsulation layer 410 may indirectly contact the second inorganic encapsulation layer 430.

In the peripheral area PA, there may be a portion where the second electrode 270, the bank 350, the protective layer 180, and the like are not positioned. In the peripheral area PA, the encapsulation layer 400 may be positioned directly above the inner heat dissipation layer 510. However, this is only an example, and another layer may be positioned between the inner heat dissipation layer 510 and the encapsulation layer 400 in the peripheral area PA.

An external heat dissipation layer 520 may be positioned on an outer surface of the first substrate 110. Accordingly, the first substrate 110 may be positioned between the external heat dissipation layer 520 and the buffer layer 111. A hole 601 may be formed in the first substrate 110 in the peripheral area PA. The hole 601 may also be formed in the buffer layer 111, the gate insulating layer 120, and the interlayer insulating layer 160 that are positioned in the peripheral area PA. The external heat dissipation layer 520 may be located inside the hole 601. A part of the external heat dissipation layer 520 positioned inside the hole 601 and a part of the external heat dissipation layer 520 positioned on the outer surface of the first substrate 110 may be integral each other. The external heat dissipation layer 520 may be connected to the inner heat dissipation layer 510 through the hole 601. The external heat dissipation layer 520 may be formed of a non-conductive material, and may be formed of a material having a high thermal conductivity. The external heat dissipation layer 520 may be made of a transparent material or may be made of a non-transparent material. The external heat dissipation layer 520 and the inner heat dissipation layer 510 may be made of the same material, or may be made of a different material.

Heat generated from the display device may be radiated to the outside by the inner heat dissipation layer 510 and the external heat dissipation layer 520, thereby improving the efficiency and life-span of the light emitting element. The inner heat dissipation layer 510 and an element positioned inside the display device may be positioned on the same layer, and the external heat dissipation layer 520 positioned outside the display device may be connected to the inner heat dissipation layer 510, thereby effectively dissipating heat.

The position and shape of the hole 601 formed in the first substrate 110 in the peripheral area PA may be variously changed. Hereinafter, various positions and shapes of the hole 601 will be described with reference to FIG. 2 to FIG. 4.

Figure 2:
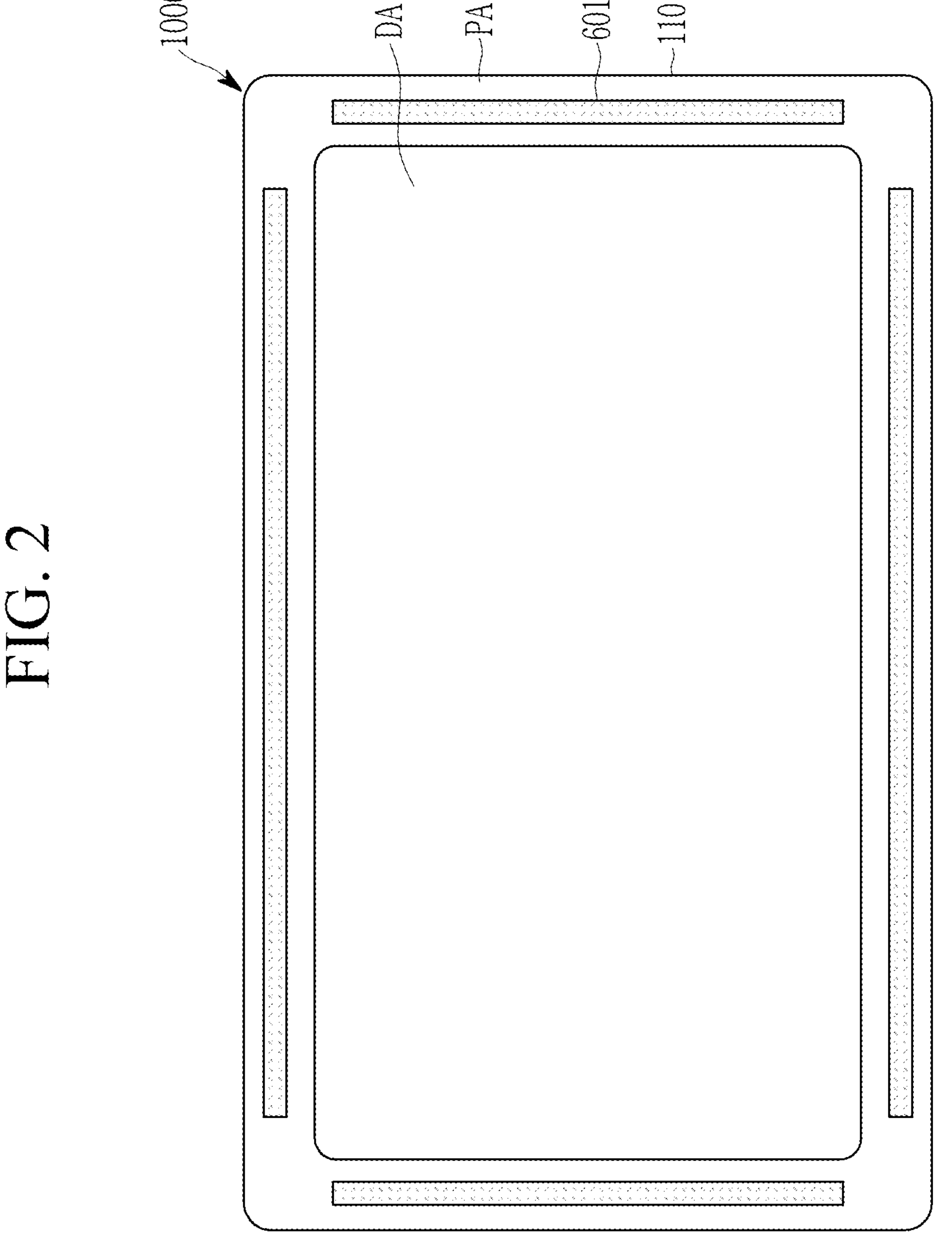
Figure 3:
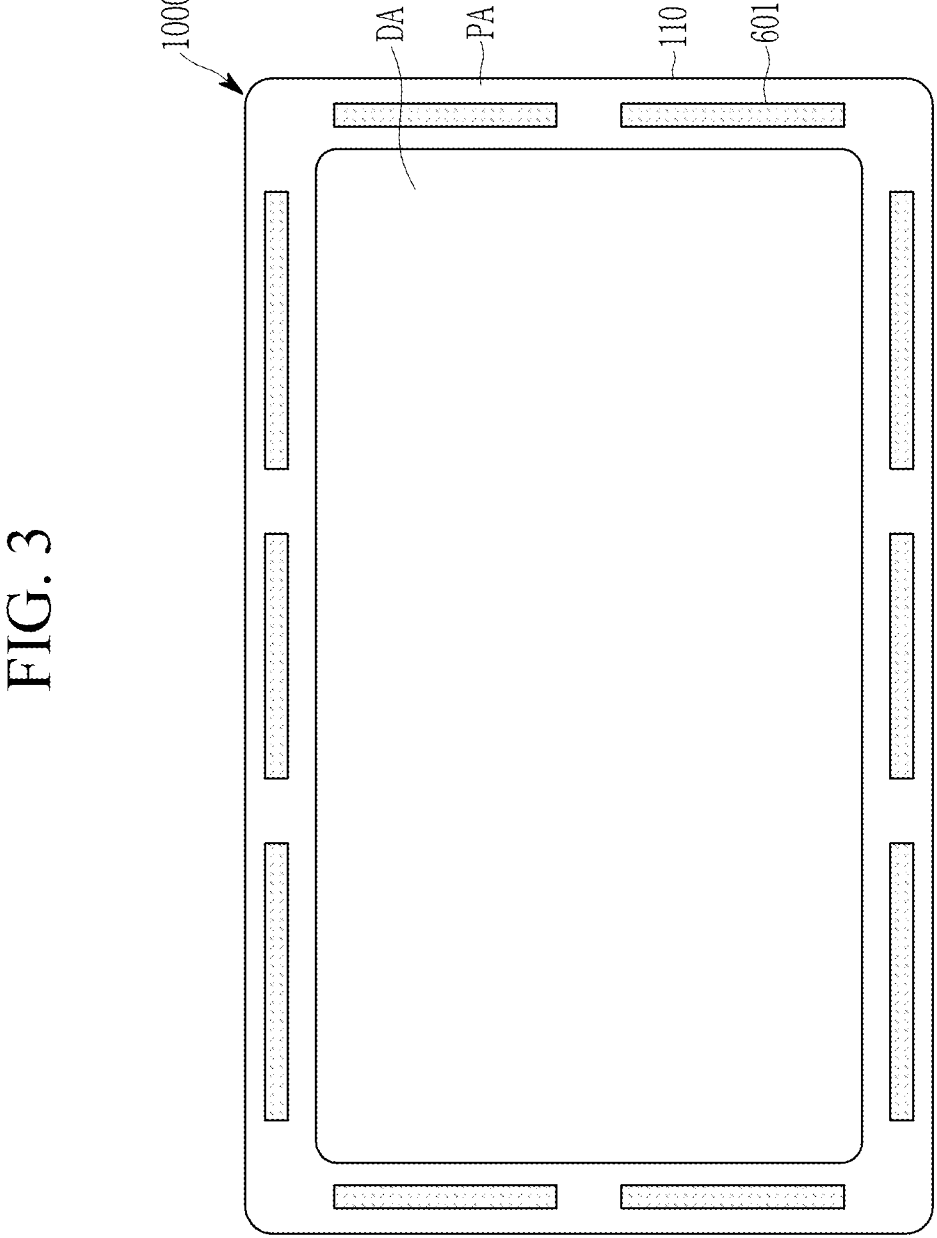
Figure 4:
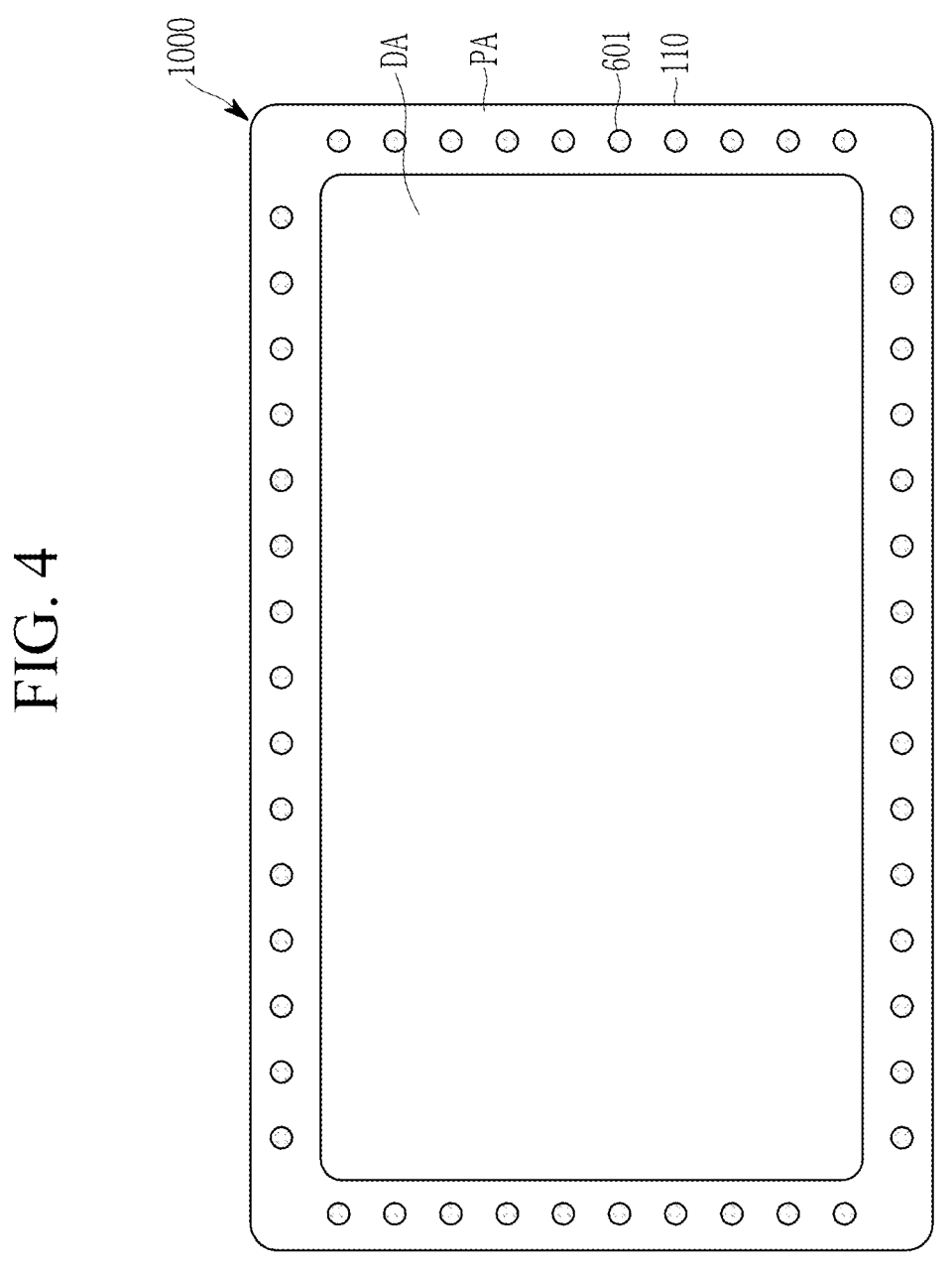

FIG. 2 to FIG. 4 are plan views of a display device according to an embodiment.

As shown in FIG. 2, a display device 1000 according to an embodiment may include a first substrate 110 that includes a display area DA and a peripheral area PA. The peripheral area PA may be positioned outside the display area DA, and may have a shape surrounding the display area DA.

Multiple holes 601 may be formed in the first substrate 110 in the peripheral area PA, and the holes 601 may be disposed to be spaced apart from each other. Each of the holes 601 may have a bar shape extending along an edge of the first substrate 110 in a plan view. For example, four holes 601 may be formed in the first substrate 110, and each may be formed in a bar shape extending along the upper edge, the left edge, the right edge, and the lower edge of the first substrate 110, respectively. Each of the holes 601 may be positioned inside the edge of the first substrate 110. For example, each of the holes 601 may be spaced apart from the edge of the first substrate 110 by a predetermined (or selectable) interval.

As shown in FIG. 3, ten holes 601 may be formed in the first substrate 110. Three holes 601 may be formed adjacent to the upper edge of the first substrate 110, two holes 601 may be formed adjacent to the left edge of the first substrate 110, two holes 601 may be formed adjacent to the right edge of the first substrate 110, and three holes 601 may be formed adjacent to the lower edge of the first substrate 110.

As shown in FIG. 4, each of the holes 601 may have a dot shape in a plan view. The holes 601 may be disposed to be spaced apart at a predetermined (or selectable) interval.

Although the arrangement and shape of the hole 601 formed in the first substrate 110 has been described above, this is only an example, and the arrangement and shape of the holes 601 may be variously changed. The holes 601 may not have a uniform shape. The holes 601 may have different shapes and may be disposed at different intervals.

Hereinafter, a manufacturing method of a display device according to an embodiment will be described with reference to FIG. 5 to FIG. 11.

FIG. 5 to FIG. 11 are schematic cross-sectional views showing manufacturing processes of a display device according to an embodiment.

Figure 5:
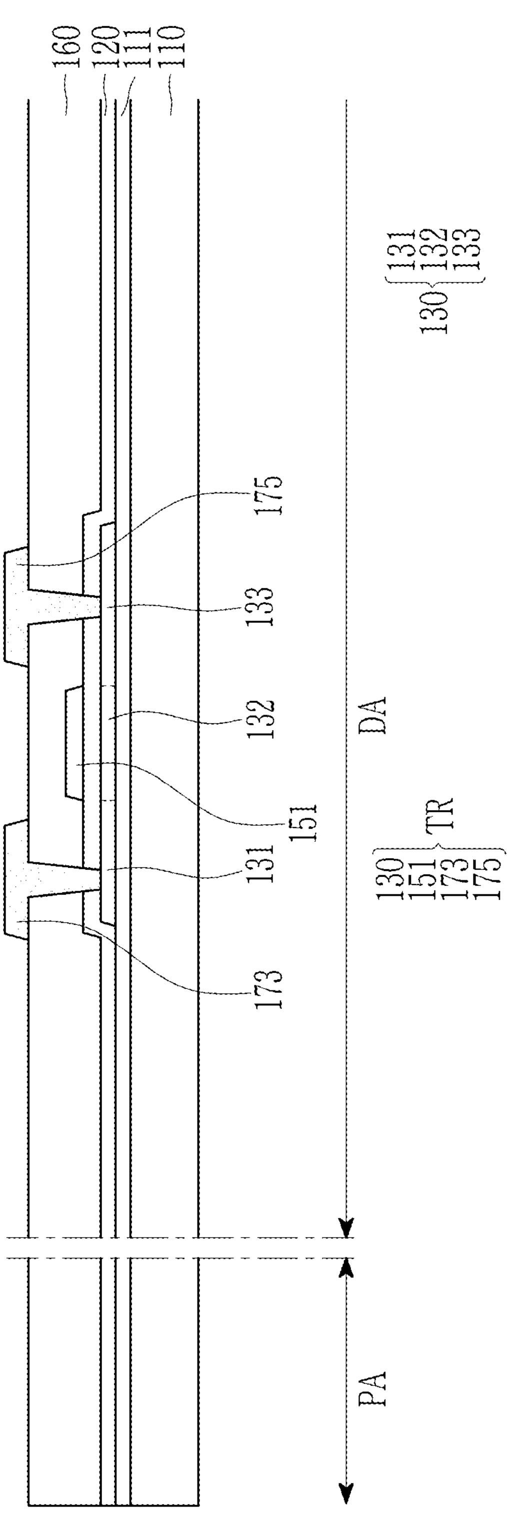

As shown in FIG. 5, a transistor TR may be formed on a first substrate 110.

The first substrate 110 may include a display area DA and a peripheral area PA. A buffer layer 111 may be formed using an inorganic insulating material such as silicon nitride ($SiN_x$), silicon oxide ($SiO_x$), silicon oxynitride ($SiO_xN_y$), and the like, or an organic insulating material on the first substrate 110. The buffer layer 111 may be entirely formed on the display area DA and the peripheral area PA. However, the disclosure is not limited thereto, and the buffer layer 111 may be not positioned on the peripheral area PA.

A semiconductor 130 may be formed on the buffer layer 111 using a semiconductor material. The semiconductor material may be amorphous silicon, a polysilicon, an oxide semiconductor, and the like. A gate insulating layer 120 may be formed using an inorganic insulating material such as silicon nitride ($SiN_x$), silicon oxide ($SiO_x$), silicon oxynitride ($SiO_xN_y$), and the like on the semiconductor 130.

A gate electrode 151 may be formed on the gate insulating layer 120 using a metallic material. The gate electrode 151 may overlap a part of the semiconductor 130. After forming the gate electrode 151, a doping process or a plasma treatment may be performed. A portion of the semiconductor 130 covered by the gate electrode 151 may be not doped or plasma-treated, and a portion of the semiconductor 130 not covered by the gate electrode 151 may be doped or plasma-treated to have the same characteristic as the conductor. The portion that is not doped or plasma-treated may be a channel 132 of the semiconductor 130, and the portion that is doped or plasma-treated may be a first region 131 and a second region 133 of the semiconductor 130. The channel 132 of the semiconductor 130 may be positioned between the first region 131 and the second region 133.

An interlayer insulating layer 160 may be formed using an inorganic insulating material or an organic insulating material on the gate electrode 151 and the gate insulating layer 120. An opening may be formed by patterning the interlayer insulating layer 160 such that at least a part of the first region 131 and second region 133 may be exposed. A source electrode 173 and a drain electrode 175 may be formed on the interlayer insulating layer 160 using a metallic material. The source electrode 173 may be electrically connected to the first region 131 of the semiconductor 130 through the opening of the interlayer insulating layer 160. The drain electrode 175 may be electrically connected to the second region 133 of the semiconductor 130 through the opening of the interlayer insulating layer 160.

The semiconductor 130, the gate electrode 151, the source electrode 173, and the drain electrode 175 may form a transistor TR. The transistor TR may be positioned on an inner surface of the first substrate 110. The transistor TR may be positioned in the display area DA of the first substrate 110.

Figure 6:
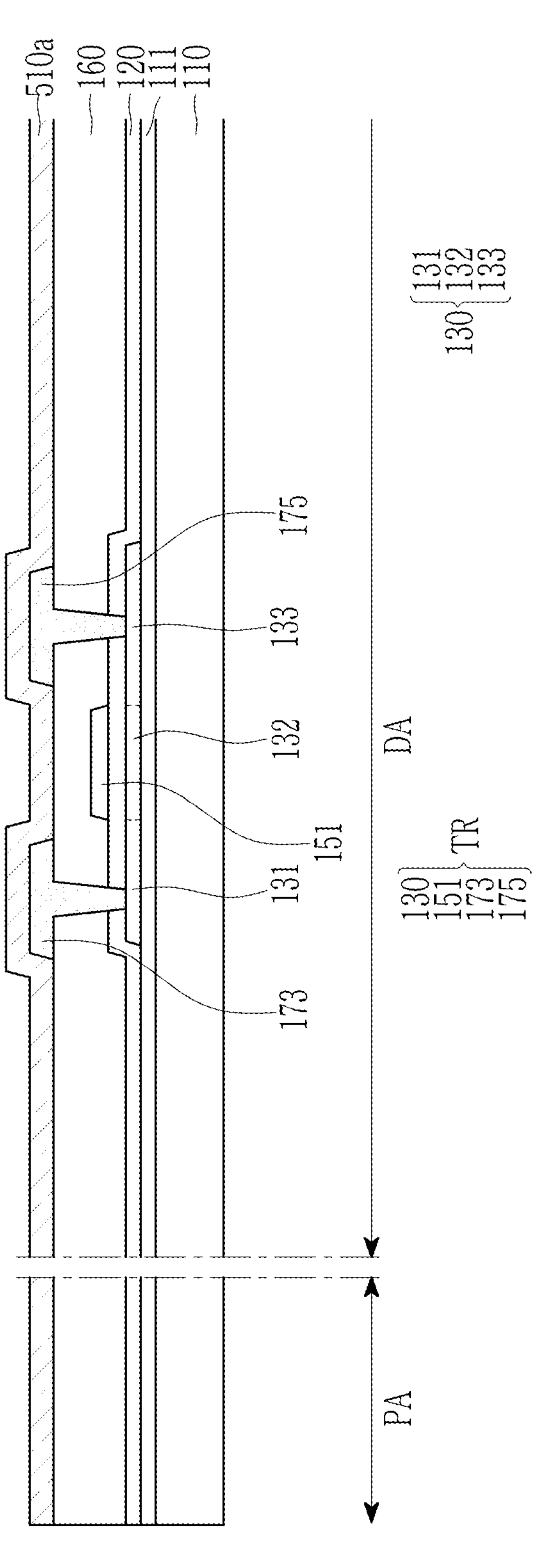

As shown in FIG. 6, a heat radiation material layer **510*a* may be formed by depositing a heat radiation material on the transistor TR. The heat radiation material layer 510*a* may be formed of a non-conductive material, and may be formed of a material having a high thermal conductivity. The heat radiation material layer 510*a* may be positioned on the source electrode 173, the drain electrode 175, and the interlayer insulating layer 160. The heat radiation material layer 510*a* may be entirely formed on the display area DA and the peripheral area PA of the first substrate 110. A thickness of the heat radiation material layer 510*a* may be substantially similar to a thickness of the source electrode 173 and drain electrode 175**.

Figure 7:
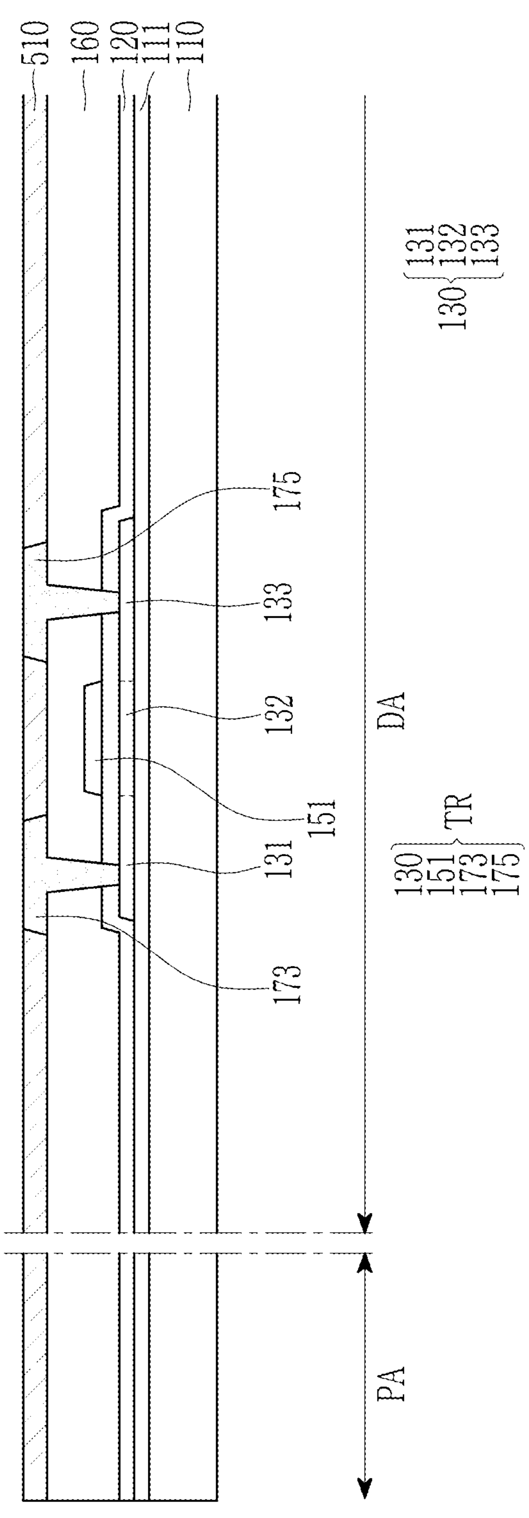

As shown in FIG. 7, an inner heat dissipation layer 510 may be formed by patterning the heat radiation material layer **510*a*. A portion of the heat radiation material layer 510*a* positioned on the source electrode 173 and the drain electrode 175 may be removed, and a portion of the heat radiation material layer 510*a* positioned on the remaining portion may remain as an inner heat dissipation layer 510. The inner heat dissipation layer 510 may be formed of a material that is different from that of the source electrode 173 and the drain electrode 175, may be formed through a separate process, and may not be integral each other. A buffer layer 111, a gate insulating layer 120, and an interlayer insulating layer 160 may be positioned between the first substrate 110 and the inner heat dissipation layer 510. In some embodiments, at least a portion of the buffer layer 111, the gate insulating layer 120, and the interlayer insulating layer 160 in the peripheral area PA may be omitted. Therefore, at least some of the buffer layer 111, the gate insulating layer 120, and the interlayer insulating layer 160 may not be positioned under the inner heat dissipation layer 510 in the peripheral area PA. The inner heat dissipation layer 510 may be positioned directly on the inner surface of the first substrate 110 in the peripheral area PA. A side surface of the inner heat dissipation layer 510 may contact a side surface of the source electrode 173 and a side surface of the drain electrode 175. A thickness of the inner heat dissipation layer 510 may be substantially similar to a thickness of the source electrode 173 and drain electrode 175. Accordingly, a surface of the inner heat dissipation layer 510 and an upper surface of the source electrode 173 and drain electrode 175** may be formed flat.

Figure 8:
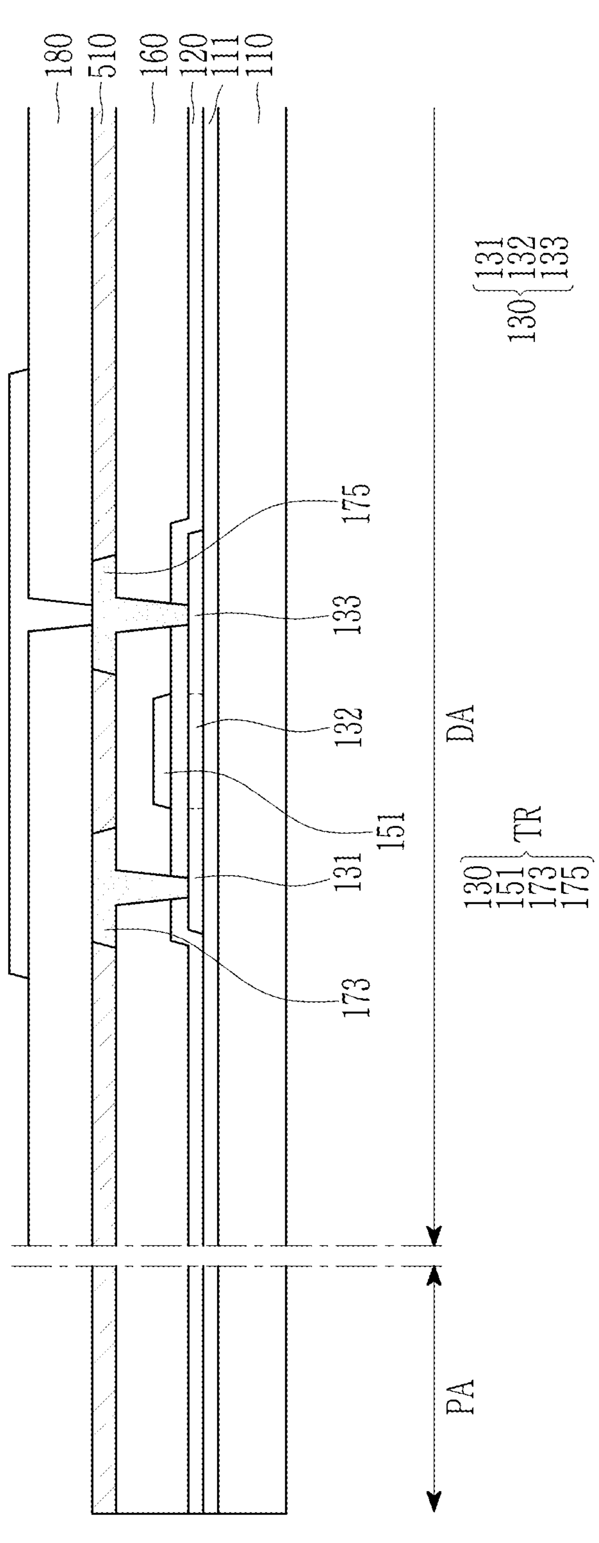

As shown in FIG. 8, a protective layer 180 may be formed using an organic insulating material on the source electrode 173, the drain electrode 175, and the inner heat dissipation layer 510. An opening may be formed to exposed at least a part of the drain electrode 175 by patterning the protective layer 180. A first electrode 191 may be formed using a transparent conductive oxide film or a metallic material on the protective layer 180. The first electrode 191 may be electrically connected to the drain electrode 175 through the opening of the protective layer 180.

Figure 9:
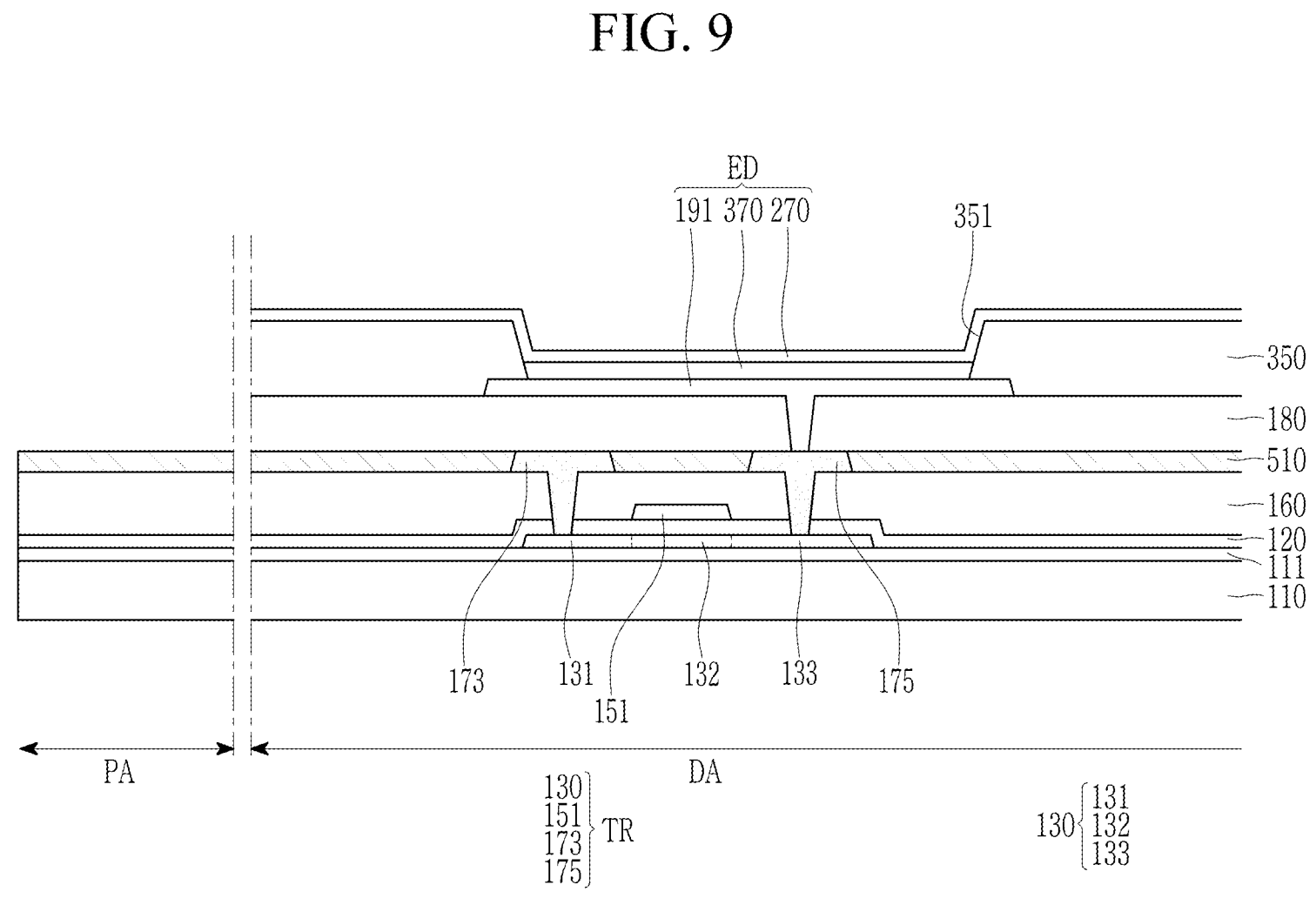

As shown in FIG. 9, a bank 350 may be formed using an organic insulating material on the first electrode 191 and the protective layer 180. A pixel opening 351 may be formed to expose at least a part of the first electrode 191 by patterning the bank 350. The pixel opening 351 may overlap a central portion of the first electrode 191. Accordingly, the bank 350 may be formed to cover an edge of the first electrode 191.

An emission layer 370 may be formed on the first electrode 191. The emission layer 370 may be formed to be positioned in the pixel opening 351. The emission layer 370 may include an organic material that emits light such as red, green, and blue. The emission layer 370 may include a low-molecular or high-molecular organic material.

A second electrode 270 may be formed on the emission layer 370 and the bank 350 using a transparent conductive oxide film or a metallic material. The first electrode 191, the emission layer 370, and the second electrode 270 may form a light emitting element ED. The light emitting element ED may be positioned on the protective layer 180 and electrically connected to the transistor TR. In the display device according to the embodiment, inner heat dissipation layer 510 having a thickness substantially similar to that of the source electrode 173 and the drain electrode 175 may be formed, and the upper surface of the protective layer 180 may be flattened by forming the protective layer 180 thereon. It is thereby possible to prevent the concentration of heat in some regions of the light emitting element ED, to reduce the generated heat, and to improve efficiency and life-span of the light emitting element ED by forming the light emitting element ED on the flat protective layer 180.

Figure 10:
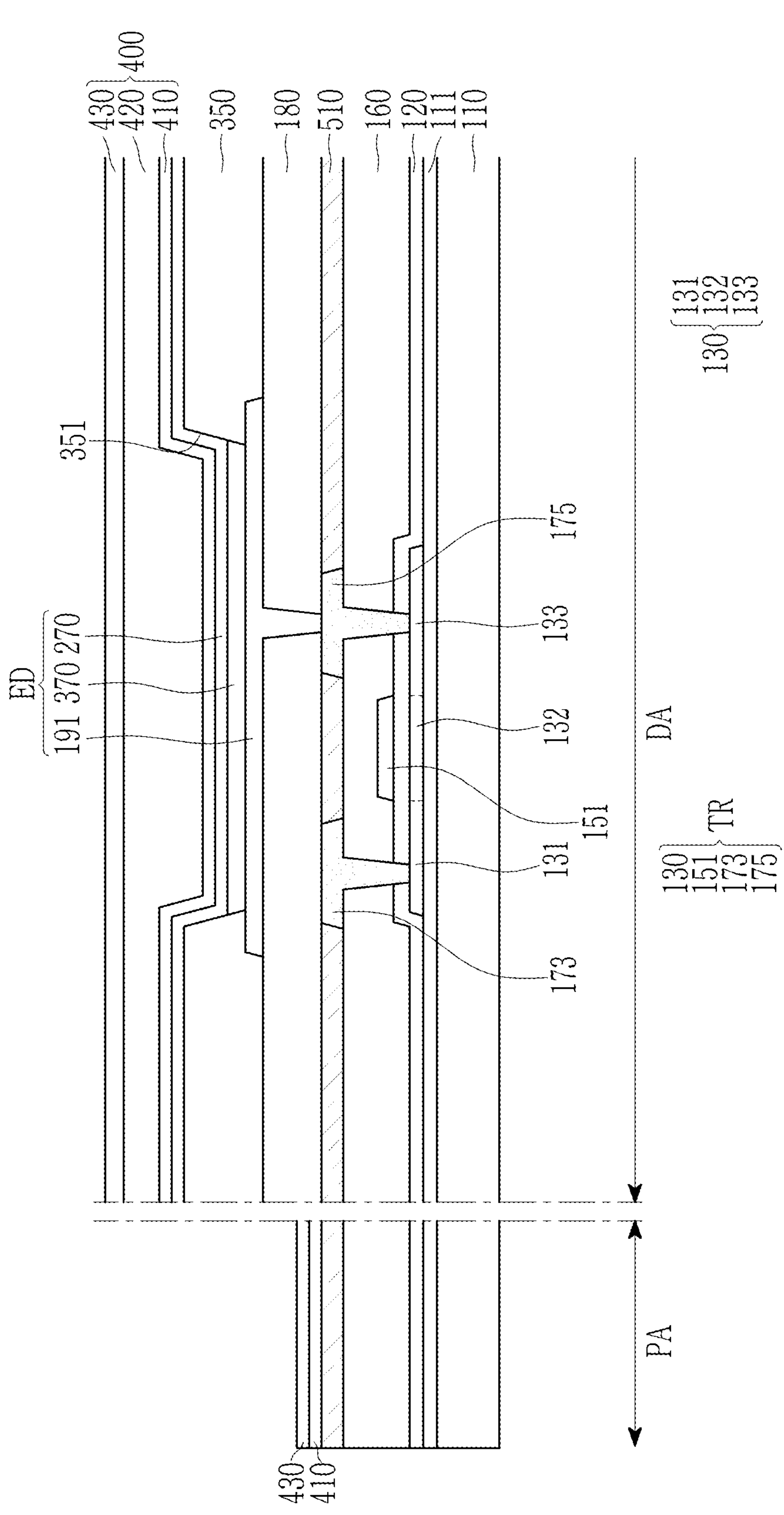

As shown in FIG. 10, an encapsulation layer 400 may be formed on the light emitting element ED. The encapsulation layer 400 may include at least one inorganic layer and at least one organic layer. In the embodiment, the encapsulation layer 400 may include a first inorganic encapsulation layer 410, an organic encapsulation layer 420, and a second inorganic encapsulation layer 430. In the peripheral area PA, the encapsulation layer 400 may be positioned directly above the inner heat dissipation layer 510.

Figure 11:
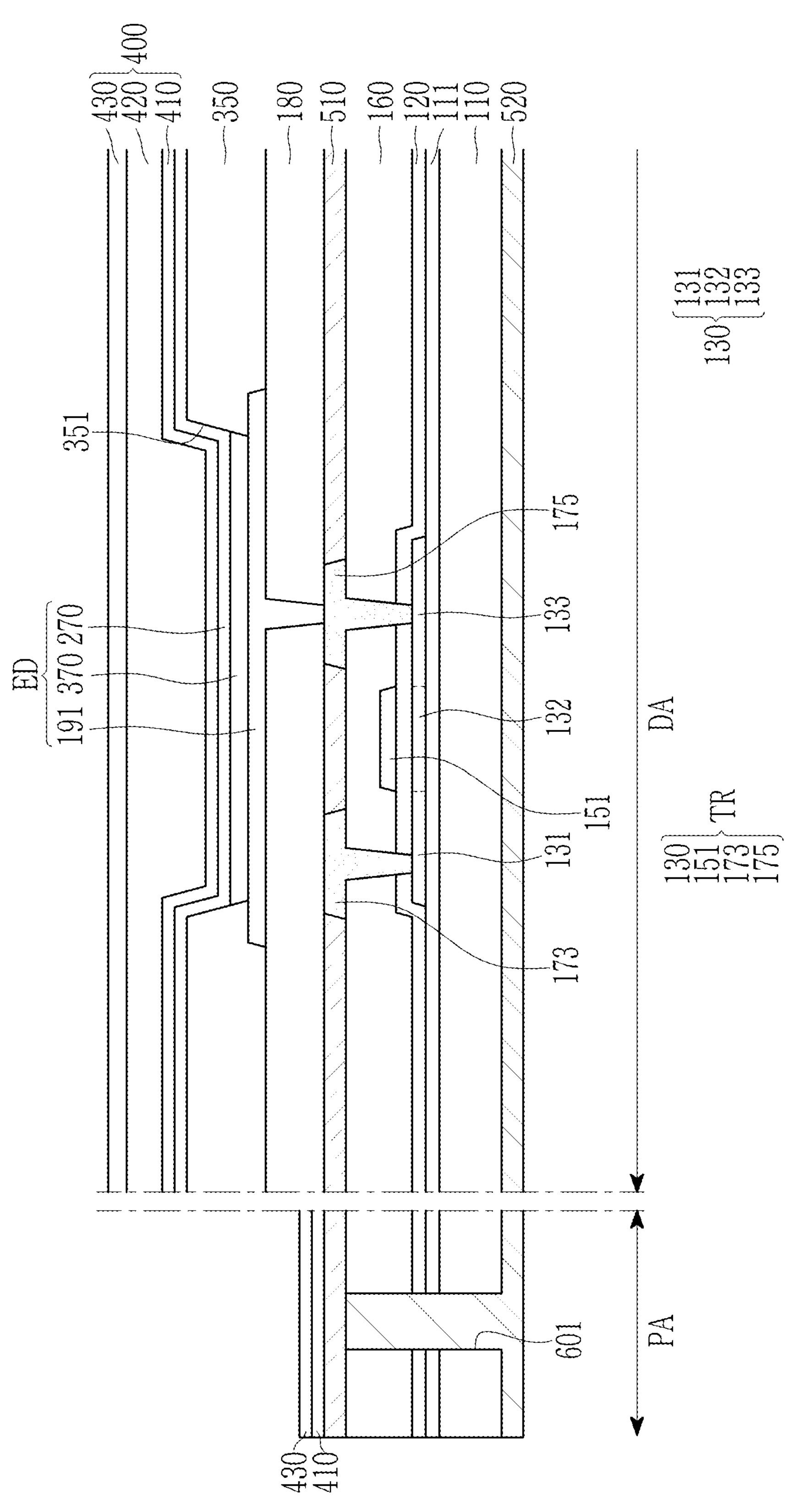

As shown in FIG. 11, a hole 601 may be formed in the first substrate 110 in the peripheral area PA. The hole 601 may be formed not only in the first substrate 110 but also in the buffer layer 111, the gate insulating layer 120, and the interlayer insulating layer 160 positioned on the first substrate 110.

A heat dissipation material may be deposited on the outer surface of the first substrate 110 to form an external heat dissipation layer 520. The external heat dissipation layer 520 may be formed of a non-conductive material, and may be formed of a material having a high thermal conductivity. The external heat dissipation layer 520 may be formed on the outer surface of the first substrate 110 and inside the hole 601. The external heat dissipation layer 520 may be formed to fill the inside of the hole 601. The external heat dissipation layer 520 may be connected to the inner heat dissipation layer 510 through the hole 601.

Heat generated from the display device may be radiated to the outside by the inner heat dissipation layer 510 and the external heat dissipation layer 520, thereby improving the efficiency and life-span of the light emitting element. The inner heat dissipation layer 510 and the element positioned inside the display device may be positioned on the same layer, and the external heat dissipation layer 520 positioned outside the display device may be connected to the inner heat dissipation layer 510, thereby effectively dissipating heat.

A display device according to an embodiment will be described with reference to FIG. 12.

Figure 12:
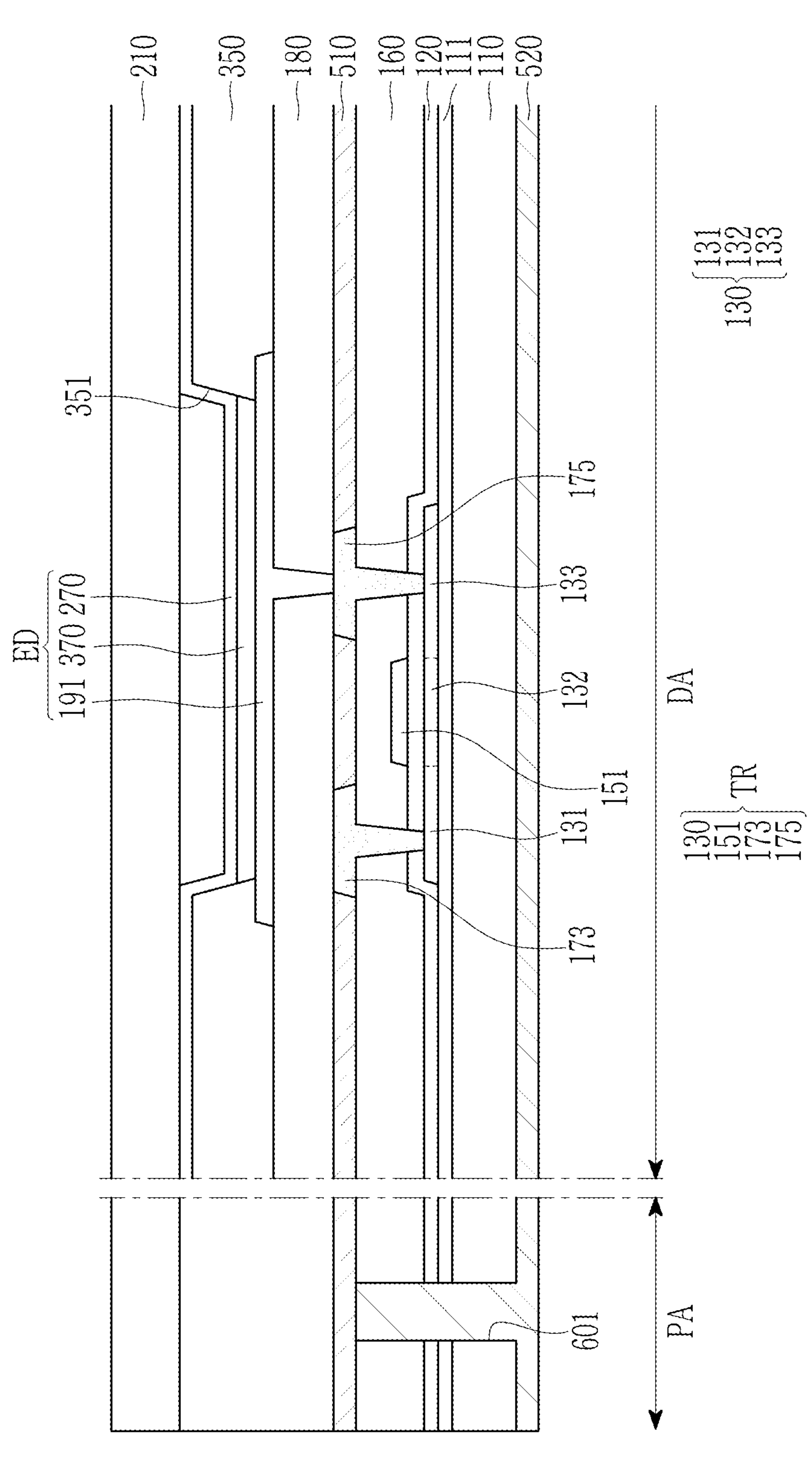
FIG. 12 is a schematic cross-sectional view of a display device according to an embodiment.

A display device according to an embodiment shown in FIG. 12 is similar to the display device according to the embodiment shown in FIG. 1, and the description of the same parts will be omitted. The embodiment is different from the embodiment in FIG. 1 in that it additionally includes a second substrate, which will be further described below.

FIG. 12 is a schematic cross-sectional view of a display device according to an embodiment.

As shown in FIG. 12, a display device according to an embodiment may include a first substrate 110, a transistor TR positioned on the first substrate 110, a light emitting element ED electrically connected to the transistor TR, an inner heat dissipation layer 510 positioned below the light emitting element ED, and an external heat dissipation layer 520 connected to the inner heat dissipation layer 510.

The display device according to the embodiment may further include a second substrate 210 positioned on the light emitting element ED. The second substrate 210 and the first substrate 110 may be formed of the same material, or may be formed of a different material.

In the previous embodiment, the display device may be sealed by an encapsulation layer formed of multiple thin films, and in the embodiment, the display device may be sealed by the first substrate 110 and the second substrate 210 facing each other.

Although not shown, a sealing member may be positioned between the first substrate 110 and the second substrate 210. The sealing member may be positioned in the peripheral area PA.

A display device according to an embodiment will be described with reference to FIG. 13.

Figure 13:
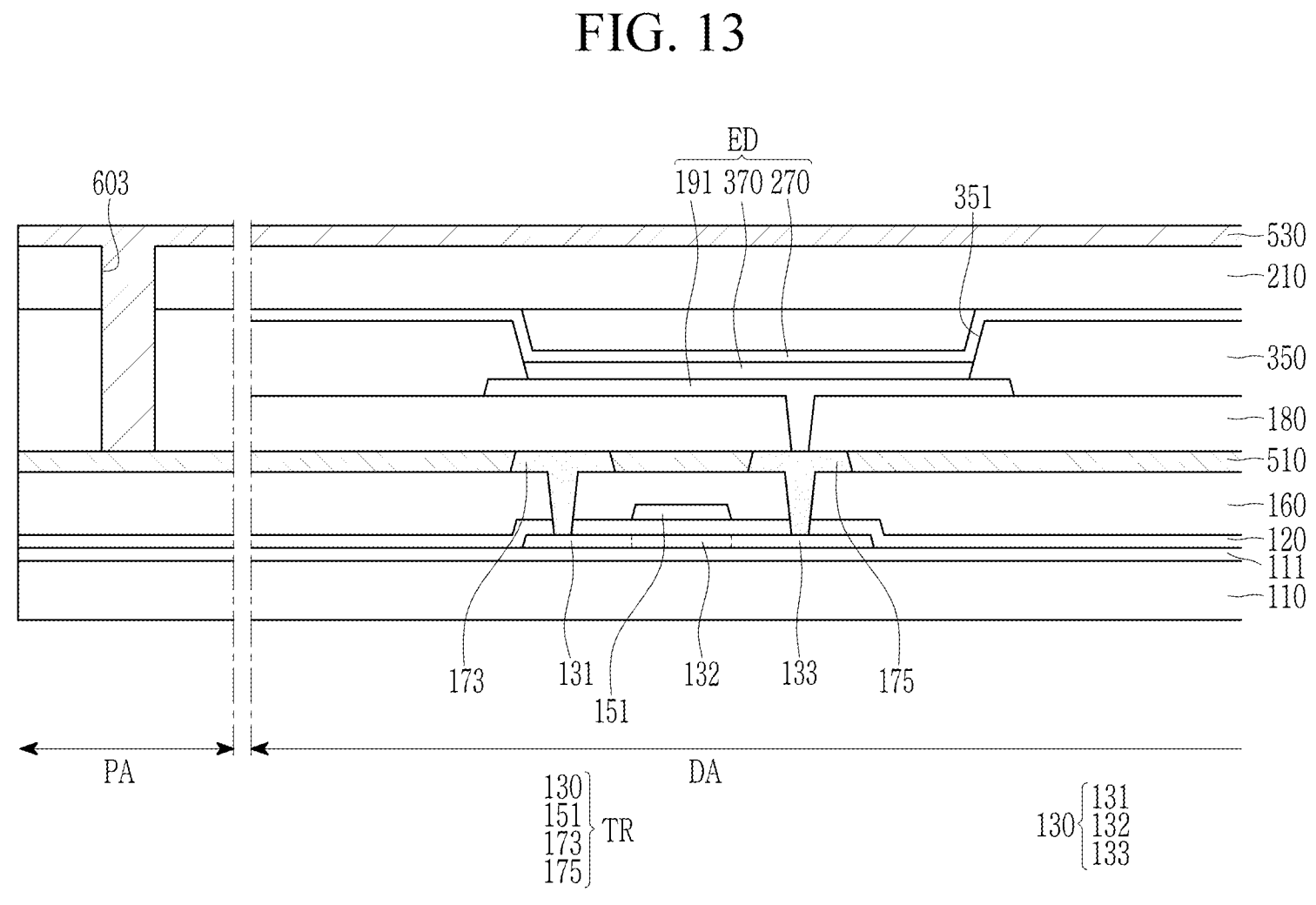

A display device according to an embodiment shown in FIG. 13 is similar to the display device according to the embodiment shown in FIG. 12, and the description of the same portions will be omitted. In the embodiment, a position where an external heat dissipation layer is formed is different from the previous embodiments, which will be described further below.

FIG. 13 is a schematic cross-sectional view of a display device according to an embodiment.

As shown in FIG. 13, a display device according to an embodiment may include a first substrate 110, a transistor TR positioned on the first substrate 110, a light emitting element ED positioned on the transistor TR, an inner heat dissipation layer 510 positioned below the light emitting element ED, an external heat dissipation layer 530 connected to the inner heat dissipation layer 510, and a second substrate 210 positioned on the light emitting element ED.

In the preceding embodiments, the external heat dissipation layer may be positioned on the outer surface of the first substrate, and in the embodiment, the external heat dissipation layer 530 may be positioned on the outer surface of the second substrate 210.

The second substrate 210 may include a display area DA and a peripheral area PA positioned outside the display area DA. A hole 603 may be formed in the second substrate 210 in the peripheral area PA. The external heat dissipation layer 530 may be positioned on the outer surface of the second substrate 210 and inside the hole 603. The external heat dissipation layer 530 may be entirely formed on the display area DA and the peripheral area PA of the second substrate 210. The interior of the hole 603 may be filled by the external heat dissipation layer 530. The external heat dissipation layer 530 may be connected to the inner heat dissipation layer 510 through the hole 603. The external heat dissipation layer 530 may be formed of a non-conductive material, and may be made of a material having a high thermal conductivity. The external heat dissipation layer 520 may be formed of a transparent material. In case that the display device according to the embodiment emits light upward, light emitted from the light emitting element ED may pass through the external heat dissipation layer 520 formed of a transparent material. The external heat dissipation layer 530 and the inner heat dissipation layer 510 may be formed of the same material, or may be formed of a different material.

Heat generated from the display device may be radiated to the outside by the inner heat dissipation layer 510 and the external heat dissipation layer 530, thereby improving efficiency and life-span of the light emitting element.

A display device according to an embodiment will be described with reference to FIG. 14 and FIG. 15.

Figure 14:
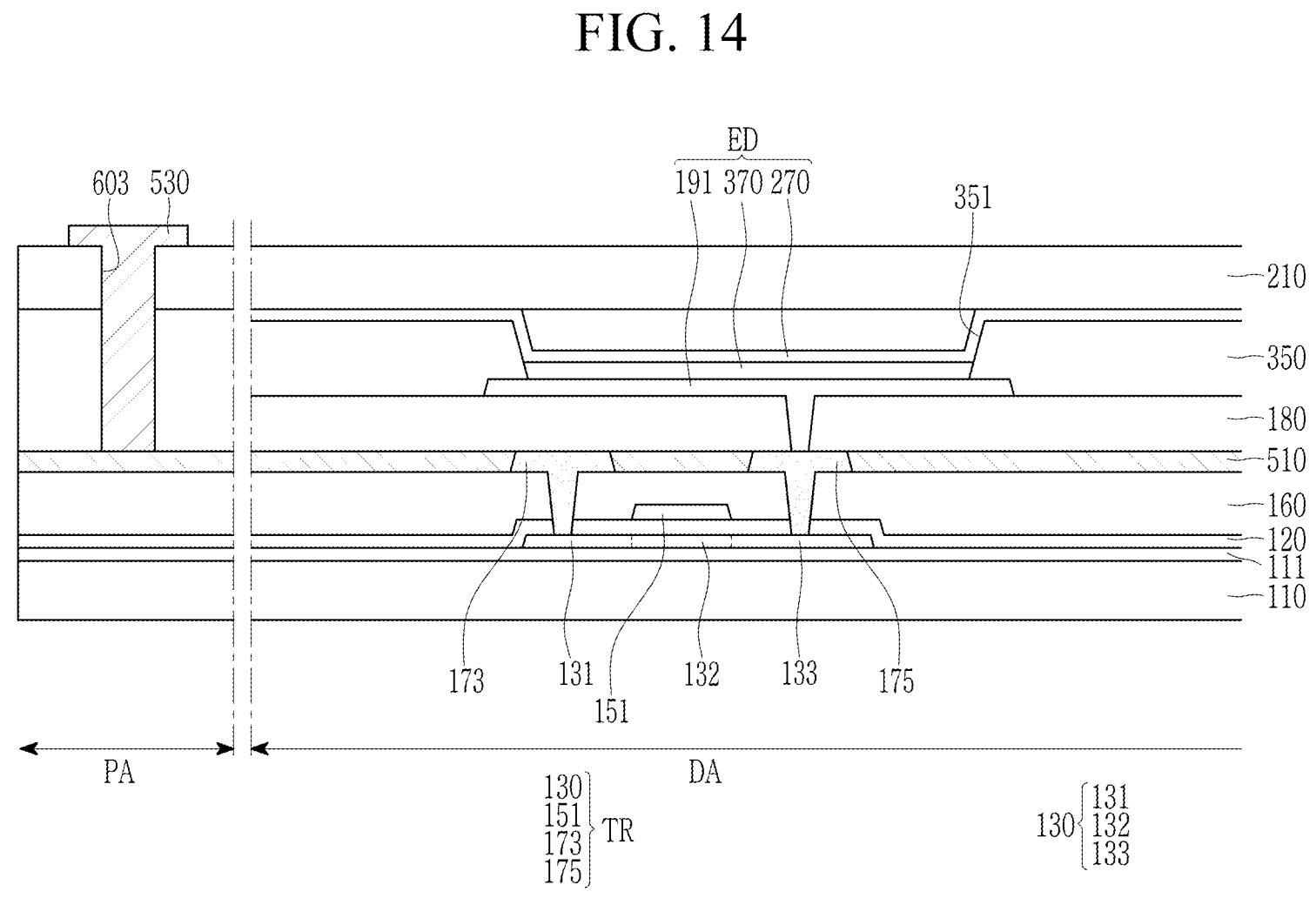
Figure 15:
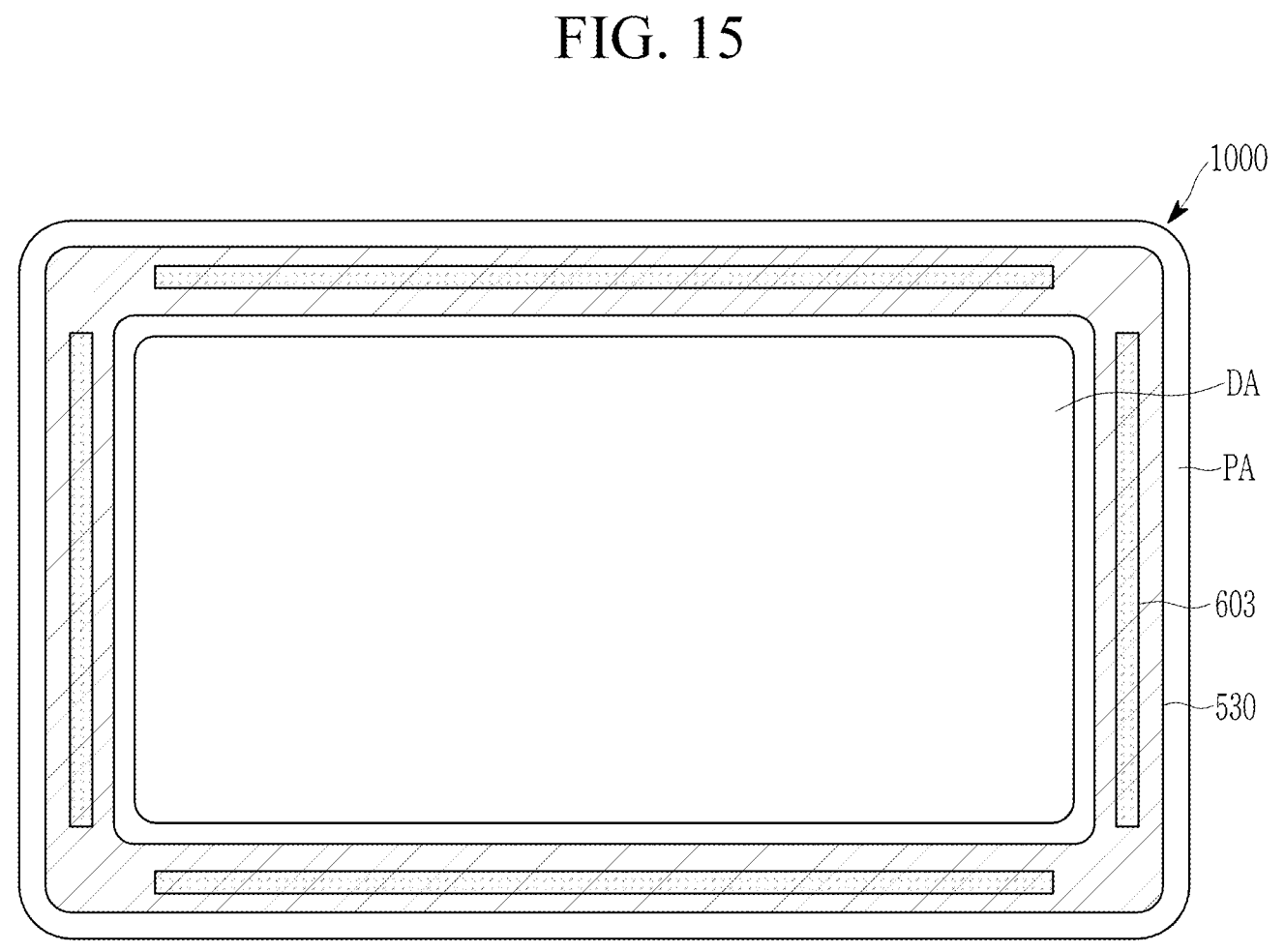

A display device according to an embodiment shown in FIG. 14 and FIG. 15 is similar to the display device according to the embodiment shown in FIG. 13, and the description of the same portion will be omitted. The embodiment is different from the previous embodiment in that an external heat dissipation layer is positioned only in some region, which will be described further below.

FIG. 14 is a schematic cross-sectional view of a display device according to an embodiment, and FIG. 15 is a plan view of the display device according to the embodiment.

As shown in FIG. 14 and FIG. 15, a display device according to an embodiment may include a first substrate 110, a transistor TR positioned on the substrate 110, a light emitting element ED electrically connected to the transistor TR, an inner heat dissipation layer 510 positioned below the light emitting element ED, an external heat dissipation layer 530 connected to the inner heat dissipation layer 510, and a second substrate 210 positioned on the light emitting element ED.

In the previous embodiments, the external heat dissipation layer 530 may be positioned entirely over the display area DA and the peripheral area PA of the second substrate 210, and in the embodiment, the external heat dissipation layer 530 may be positioned over a portion of the second substrate 210.

The external heat dissipation layer 530 may be positioned on the second substrate 210 in a peripheral area PA. The external heat dissipation layer 530 may be positioned on a portion of the second substrate 210 in the peripheral area PA, but may not be positioned in a display area DA. The external heat dissipation layer 530 may be formed to fill an inside of a hole 603 formed in the second substrate 210 in the peripheral area PA. The external heat dissipation layer 530 may be connected to the inner heat dissipation layer 510 through the hole 603. The external heat dissipation layer 530 may be formed of a non-conductive material, and may be formed of a material having a high thermal conductivity. The external heat dissipation layer 520 may be formed of a transparent material or may be formed of a non-transparent material. Since the external heat dissipation layer 520 is not formed in the display area DA, even though it is formed of a non-transparent material, the light efficiency of light emitted from the light emitting element ED may not be affected. The external heat dissipation layer 530 and the inner heat dissipation layer 510 may be formed of the same material, or may be formed of a different material.

Heat generated from the display device may be radiated to the outside by the inner heat dissipation layer 510 and the external heat dissipation layer 530, thereby improving the efficiency and life-span of the light emitting element.

While this disclosure has been described in connection with what is considered to be practical embodiments, it is to be understood that the disclosure is not limited to the disclosed embodiments. On the contrary, it is intended to cover various modifications and equivalent arrangements without departing from the spirit and scope of the appended claims.

What is claimed is:

1. A display device comprising:
a first substrate;
a transistor disposed on the first substrate;
a light emitting element electrically connected to the transistor;
an inner heat dissipation layer disposed below the light emitting element and formed of a non-conductive material having thermal conductivity; and
an external heat dissipation layer connected to the inner heat dissipation layer, wherein the transistor comprises:
a semiconductor including a channel and disposed on the first substrate;
a gate electrode that overlaps the channel in a plan view; and
a source electrode and a drain electrode that are electrically connected to the semiconductor,
wherein the inner heat dissipation layer, the source electrode, and the drain electrode are disposed in a same layer, and
a thickness of the inner heat dissipation layer, a thickness of the source electrode, and a thickness of the drain electrode are equal to each other, and
the gate electrode is disposed between the inner heat dissipation layer and the channel in a cross-sectional view.

2. The display device of claim 1, further comprising:
a gate insulating layer disposed between the semiconductor and the gate electrode; and an interlayer insulating layer disposed on the gate electrode,
wherein the source electrode, the drain electrode, and the inner heat dissipation layer are disposed on the interlayer insulating layer.

3. The display device of claim 1, further comprising: a protective layer disposed on the source electrode, the drain electrode, and the inner heat dissipation layer,
wherein the light emitting element is disposed on the protective layer.

4. The display device of claim 1, wherein
the display device comprises a display area and a peripheral area disposed adjacent to the display area,
a hole is formed in the first substrate in the peripheral area,
the external heat dissipation layer is disposed on an outer surface of the first substrate and in the hole, and
the external heat dissipation layer is connected to the inner heat dissipation layer through the hole.

5. The display device of claim 4, wherein
a plurality of holes that are spaced apart from each other are formed in the first substrate in the peripheral area, and
each of the plurality of holes has a bar shape or a dot shape in a plan view arranged along an edge of the first substrate.

6. The display device of claim 1, further comprising: an encapsulation layer disposed on the light emitting element.

7. The display device of claim 1, further comprising: a second substrate disposed on the light emitting element,
wherein the external heat dissipation layer is disposed on an outer surface of the second substrate.

8. The display device of claim 7, wherein
the display device comprises a display area and a peripheral area disposed adjacent to the display area, and
the external heat dissipation layer is disposed on the second substrate in the peripheral area.

9. A method for manufacturing a display device comprising:
forming a transistor on a first substrate;
forming an inner heat dissipation layer by depositing a first heat radiation material on the transistor and patterning the first heat radiation material, the inner heat dissipation layer being non-conductive and having thermal conductivity;
forming a light emitting element electrically connected to the transistor on the inner heat dissipation layer; and
forming an external heat dissipation layer to be connected to the inner heat dissipation layer, wherein
the display device includes a display area and a peripheral area disposed adjacent to the display area,
the forming of the transistor comprises:
forming a semiconductor including a channel and on the first substrate:
forming a gate electrode to overlap the channel; and
forming a source electrode and a drain electrode to be electrically connected to the semiconductor,
wherein the inner heat dissipation layer, the source electrode, and the drain electrode are
disposed in a same layer,
a thickness of the inner heat dissipation layer a thickness of the source electrode and a thickness of the drain electrode are equal to each other, and
the gate electrode is disposed between the inner heat dissipation layer and the channel in a cross-sectional view.

10. The method for manufacturing the display device of claim 9, further comprising
forming a gate insulating layer on the semiconductor; and
forming an interlayer insulating layer on the gate electrode,
wherein the source electrode, the drain electrode, and the inner heat dissipation layer are formed on the interlayer insulating layer.

11. The method for manufacturing the display device of claim 9, further comprising:
forming a protective layer on the source electrode, the drain electrode, and the inner heat dissipation layer,
wherein the light emitting element is formed on the protective layer.

12. The method for manufacturing the display device of claim 9, further comprising:
forming a hole in the first substrate in the peripheral area before forming of the external heat dissipation layer, wherein
in the forming of the external heat dissipation layer, the external heat dissipation layer is formed by depositing a second heat radiation material on an outer surface of the first substrate,
the external heat dissipation layer is disposed on the outer surface of the first substrate and inside the hole, and
the external heat dissipation layer is connected to the inner heat dissipation layer through the hole.

13. The method for manufacturing the display device of claim 12, wherein
a plurality of holes that are spaced apart from each other are formed in the first substrate in the peripheral area, and
each of the plurality of holes has a bar shape or a dot shape in a plan view arranged along an edge of the first substrate.

14. The method for manufacturing the display device of claim 9, further comprising:

forming an encapsulation layer on the light emitting element.

15. The method for manufacturing the display device of claim 9, further comprising:

forming a second substrate on the light emitting element; and forming a hole in the second substrate in the peripheral area, wherein in the forming of the external heat dissipation layer, the external heat dissipation layer is formed by depositing a second heat radiation material on an outer surface of the second substrate, the external heat dissipation layer is disposed on the outer surface of the second substrate and inside the hole, and the external heat dissipation layer is connected to the inner heat dissipation layer through the hole.

16. The method for manufacturing the display device of claim 15, wherein the external heat dissipation layer is disposed on the second substrate in the peripheral area.

* * * * *